United States Patent
Li (10) Patent No.: US 9,742,396 B2
(45) Date of Patent: Aug. 22, 2017

(54) CORE VOLTAGE RESET SYSTEMS AND METHODS WITH WIDE NOISE MARGIN

(71) Applicant: Alan Li, San Francisco, CA (US)

(72) Inventor: Alan Li, San Francisco, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 14/596,068

(22) Filed: Jan. 13, 2015

(65) Prior Publication Data

US 2015/0256174 A1   Sep. 10, 2015

Related U.S. Application Data

(62) Division of application No. 13/730,668, filed on Dec. 28, 2012, now Pat. No. 8,947,137.

(60) Provisional application No. 61/697,283, filed on Sep. 5, 2012.

(51) Int. Cl.
| | |
|---|---|
| *H03K 19/0185* | (2006.01) |
| *H03K 17/687* | (2006.01) |
| *H03L 9/00* | (2006.01) |
| *H01L 25/03* | (2006.01) |
| *H03K 19/0175* | (2006.01) |

(52) U.S. Cl.
CPC .......... *H03K 17/687* (2013.01); *H01L 25/03* (2013.01); *H03K 19/017509* (2013.01); *H03K 19/018507* (2013.01); *H03L 9/00* (2013.01); *H01L 2924/0002* (2013.01)

(58) Field of Classification Search
CPC ............. H03K 17/687; H03K 17/6871; H03K 19/017509; H03K 19/0185; H03K 19/018507

USPC ....... 327/306, 309, 318, 319, 327, 328, 333, 327/419, 427, 434, 436, 574, 581
See application file for complete search history.

(56) References Cited

U.S. PATENT DOCUMENTS

| | | | |
|---|---|---|---|
| 3,984,703 | A | 10/1976 | Jorgensen |
| 4,464,587 | A | 8/1984 | Suzuki et al. |
| 4,868,832 | A | 9/1989 | Marrington et al. |
| 5,220,660 | A | 6/1993 | Yoshizawa et al. |
| 5,233,613 | A | 8/1993 | Allen et al. |

(Continued)

FOREIGN PATENT DOCUMENTS

| | | |
|---|---|---|
| GB | 2457170 | 8/2009 |
| WO | 20040102623 | 11/2004 |

OTHER PUBLICATIONS

IEEE Journal of Solid-State Circuits, Vol. 42, No. 1, Jan. 2007.

*Primary Examiner* — William Hernandez (57) ABSTRACT

Presented systems and methods facilitate efficient reset operation. In one embodiment, a system comprises a core domain portion an I/O domain portion and a core reset I/O by-pass component. The core domain portion is configured to operate at a nominal core domain voltage level. The I/O domain portion configured to operate at a nominal I/O domain voltage level. The core reset I/O by-pass component configured to forward a reset indication to the core domain independent of the I/O domain. In one exemplary implementation the core reset I/O by-pass component is operable to receive an input reset indication at a high domain voltage level and to convert the input reset indication to a core reset signal that is less than or substantially equal to the nominal core domain voltage, wherein the high domain is voltage higher than the core domain voltage level.

20 Claims, 5 Drawing Sheets

(56) References Cited

U.S. PATENT DOCUMENTS

| | | |
|---|---|---|
| 5,339,445 A | 8/1994 | Gasztonyi |
| 5,471,189 A | 11/1995 | Dietz et al. |
| 5,510,740 A | 4/1996 | Farrell et al. |
| 5,517,441 A | 5/1996 | Dietz et al. |
| 5,530,845 A | 6/1996 | Hiatt et al. |
| 5,569,903 A | 10/1996 | Matsubara |
| 5,586,308 A | 12/1996 | Hawkins et al. |
| 5,588,099 A | 12/1996 | Mogilevsky et al. |
| 5,649,222 A | 7/1997 | Mogilevsky |
| 5,659,687 A | 8/1997 | Kim et al. |
| 5,687,382 A | 11/1997 | Kojima et al. |
| 5,737,613 A | 4/1998 | Mensch, Jr. |
| 5,758,133 A | 5/1998 | Evoy |
| 5,862,368 A | 1/1999 | Miller et al. |
| 5,889,529 A | 3/1999 | Jones et al. |
| 6,029,170 A | 2/2000 | Garger et al. |
| 6,040,845 A | 3/2000 | Melo et al. |
| 6,046,617 A | 4/2000 | Hoeld |
| 6,061,679 A | 5/2000 | Bournas et al. |
| 6,084,456 A | 7/2000 | Seol |
| 6,134,167 A | 10/2000 | Atkinson |
| 6,163,583 A | 12/2000 | Lin et al. |
| 6,169,546 B1 | 1/2001 | Bogdan |
| 6,169,984 B1 | 1/2001 | Bogdan |
| 6,191,969 B1 | 2/2001 | Pereira |
| 6,191,970 B1 | 2/2001 | Pereira |
| 6,212,645 B1 | 4/2001 | Tjandrasuwita |
| 6,216,234 B1 | 4/2001 | Sager et al. |
| 6,243,280 B1 | 6/2001 | Wong et al. |
| 6,249,284 B1 | 6/2001 | Bogdan |
| 6,275,070 B1 | 8/2001 | Pantelakis et al. |
| 6,380,764 B1 | 4/2002 | Katoh et al. |
| 6,397,340 B2 | 5/2002 | Watts, Jr. et al. |
| 6,493,856 B2 | 12/2002 | Usami et al. |
| 6,538,947 B2 | 3/2003 | Ahmed et al. |
| 6,584,003 B1 | 6/2003 | Kim et al. |
| 6,600,575 B1 | 7/2003 | Kohara |
| 6,678,831 B1 | 1/2004 | Mustafa et al. |
| 6,728,959 B1 | 4/2004 | Merkey |
| 6,754,837 B1 | 6/2004 | Helms |
| 6,762,768 B2 | 7/2004 | Dilliplane |
| 6,768,659 B2 | 7/2004 | Gillingham et al. |
| 6,775,776 B1 | 8/2004 | Vogt et al. |
| 6,804,267 B1 | 10/2004 | Long et al. |
| 6,816,809 B2 | 11/2004 | Circenis |
| 6,845,456 B1 | 1/2005 | Menezes et al. |
| 6,901,298 B1 | 5/2005 | Govindaraj et al. |
| 6,911,860 B1* | 6/2005 | Wang ................ H03K 3/356113 327/333 |
| 6,990,594 B2 | 1/2006 | Kim |
| 7,007,247 B1 | 2/2006 | Wang et al. |
| 7,043,649 B2 | 5/2006 | Terrell, II |
| 7,058,834 B2 | 6/2006 | Woods et al. |
| 7,100,013 B1 | 8/2006 | de Waal |
| 7,174,472 B2 | 2/2007 | Hill |
| 7,187,205 B2 | 3/2007 | Ramaraju et al. |
| 7,256,232 B2 | 8/2007 | Lamaze et al. |
| 7,414,550 B1 | 8/2008 | Sudharsanan |
| 7,434,072 B2 | 10/2008 | Peirson et al. |
| 7,518,399 B1 | 4/2009 | Santurkar et al. |
| 7,529,958 B2 | 5/2009 | Roth et al. |
| 7,590,815 B1 | 9/2009 | de Waal |
| 7,624,215 B2 | 11/2009 | Axford et al. |
| 7,730,248 B2 | 6/2010 | Goss et al. |
| 7,739,533 B2 | 6/2010 | Rauschmayer et al. |
| 7,945,875 B2 | 5/2011 | Anand et al. |
| 7,954,078 B1 | 5/2011 | Wang et al. |
| 8,327,173 B2 | 12/2012 | Hendin et al. |
| 8,570,077 B2 | 10/2013 | Kwon et al. |
| 8,988,146 B1* | 3/2015 | Opris ................... H03K 17/165 330/307 |
| 2001/0044909 A1 | 11/2001 | Oh et al. |
| 2002/0126751 A1 | 9/2002 | Scheurich et al. |
| 2002/0172008 A1 | 11/2002 | Michael |
| 2003/0004921 A1 | 1/2003 | Schroeder |
| 2003/0023825 A1 | 1/2003 | Woo et al. |
| 2003/0204757 A1 | 10/2003 | Flynn |
| 2003/0204761 A1 | 10/2003 | D'Alessio |
| 2003/0206164 A1 | 11/2003 | Juenger |
| 2003/0233525 A1 | 12/2003 | Reeves |
| 2004/0076062 A1 | 4/2004 | Ueda et al. |
| 2005/0015321 A1 | 1/2005 | Vindekilde |
| 2005/0125705 A1 | 6/2005 | Cheng et al. |
| 2006/0184808 A1 | 8/2006 | Chua-Eoan et al. |
| 2006/0226895 A1 | 10/2006 | Hoshi et al. |
| 2006/0238232 A1* | 10/2006 | Bourgoin ............... H03K 5/003 327/333 |
| 2007/0206018 A1 | 9/2007 | Bajic et al. |
| 2008/0016383 A1 | 1/2008 | Watanabe et al. |
| 2008/0187089 A1* | 8/2008 | Miyayama ............. G11C 19/28 377/79 |
| 2008/0307240 A1 | 12/2008 | Dahan et al. |
| 2009/0049220 A1 | 2/2009 | Conti et al. |
| 2009/0054075 A1 | 2/2009 | Boejer et al. |
| 2009/0204831 A1 | 8/2009 | Cousson et al. |
| 2009/0210831 A1 | 8/2009 | Correale et al. |
| 2009/0256607 A1 | 10/2009 | Smith et al. |
| 2009/0271167 A1 | 10/2009 | Zhu et al. |
| 2010/0064271 A1 | 3/2010 | Chen |
| 2010/0308895 A1 | 12/2010 | Koushanfar et al. |
| 2012/0054519 A1 | 3/2012 | Branover et al. |
| 2012/0105452 A1 | 5/2012 | Diard |
| 2013/0176065 A1 | 7/2013 | Balmelli |
| 2014/0043032 A1* | 2/2014 | Makino ............. H03K 17/6871 324/434 |

* cited by examiner

Receiving a reset indication at a voltage level that is not safe for a core domain and forwarding to the reset indication to a core domain at voltage level that is safe for the core domain.

---

520

Performing a voltage level restoration process.

---

530

Performing a noise margin amplification process.

FIG 5

CORE VOLTAGE RESET SYSTEMS AND METHODS WITH WIDE NOISE MARGIN

This application is a divisional application of the co-pending U.S. patent application Ser. No. 13/730,668, titled "CORE VOLTAGE RESET SYSTEMS AND METHOD WITH WIDE NOISE MARGIN," filed on Dec. 28, 2012, which claims the benefit and priority to U.S. provisional application No. 61/697,283, titled "SCHMITT RECEIVER FOR HIGH-VOLTAGE INPUT SIGNALS AND CORE VOLTAGE RESET CIRCUIT WITH WIDE NOISE MARGIN," filed on Sep. 5, 2012. The foregoing patent applications are incorporated herein by reference in entirety.

TECHNICAL FIELD

The present disclosure relates generally to the field of integrated circuits and more specifically to the field of providing reset signals to integrated circuits.

BACKGROUND

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data in most areas of business, science, education and entertainment. These devices often include a plurality of power domains with some of the power domains operating at different voltages. Some conventional integrated circuits with split power rail approaches have different power domains receiving different power supply voltages from respective different power rails. Conventional attempts at coordinating operations at the different voltage levels can be complicated and problematic.

The power domains can include a variety of functional components configured to operate at the different respective voltage levels. Some traditional systems include core power domains with functional components configured to operate at a lower voltage level than an input/output (I/O) domain. Conventional core circuits usually have to communicate with devices external to the integrated circuit through the I/O circuits to avoid damage and conventional coordination of operations in the two different domains can be problematic. For example, it is often beneficial to reset core functional components to ensure the core functional components start up in a known or predetermined state (thereby facilitating predictable results) rather than random states and unreliable results. However, conventional approaches of communicating a reset indication though traditional I/O functional components of the I/O domain can give rise to a number of issues. For example, a reset can take longer and consume more power while the I/O domain is brought up. In addition, external signals often have relatively large noise that can pose significant problems for core domains.

SUMMARY

Presented systems and methods facilitate efficient reset operation. In one embodiment, a system comprises a core domain portion an I/O domain portion and a core reset I/O by-pass component. The core domain portion is configured to operate at a nominal core domain voltage level. The I/O domain portion configured to operate at a nominal I/O domain voltage level. The core reset I/O by-pass component configured to forward a reset indication to the core domain independent of the I/O domain. In one exemplary implementation the core reset I/O by-pass component is operable to receive an input reset indication at a high domain voltage level and to convert the input reset indication to a core reset signal that is less than or substantially equal to the nominal core domain voltage, wherein the high domain is voltage higher than the core domain voltage level.

In one embodiment, the reset protection circuit can include a level restoration circuit operable to pull the converted reset signal up to the core domain voltage level. The high domain voltage can be equal to the I/O domain voltage level. The core logic portion can be operable to receive the converted reset signal before the I/O domain rail is powered up. The reset protection circuit comprises a native thick oxide N channel transistor connected in series with a thin channel transistor, wherein both the transistors have a gate coupled to the core domain voltage level; and wherein the native thick oxide N channel transistor has a threshold voltage substantially equal to or less than zero. The noise margin amplification circuit comprises as a half-Schmitt trigger circuit operable to increase the Voltage-In-Low of the core logic portion in response to the converted reset signal.

BRIEF DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

NOTATION AND NOMENCLATURE

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Presented systems and methods enable effective and efficient coordination of component resets. In one embodiment, a reset indication can propagate to core domains before bringing up the I/O domain components. In one exemplary implementation, propagating the reset indication to the core before bringing up the I/O domain components reduces start up time and power consumption. In one embodiment, systems and methods also enable reset with wide noise margins.

Figure 1:
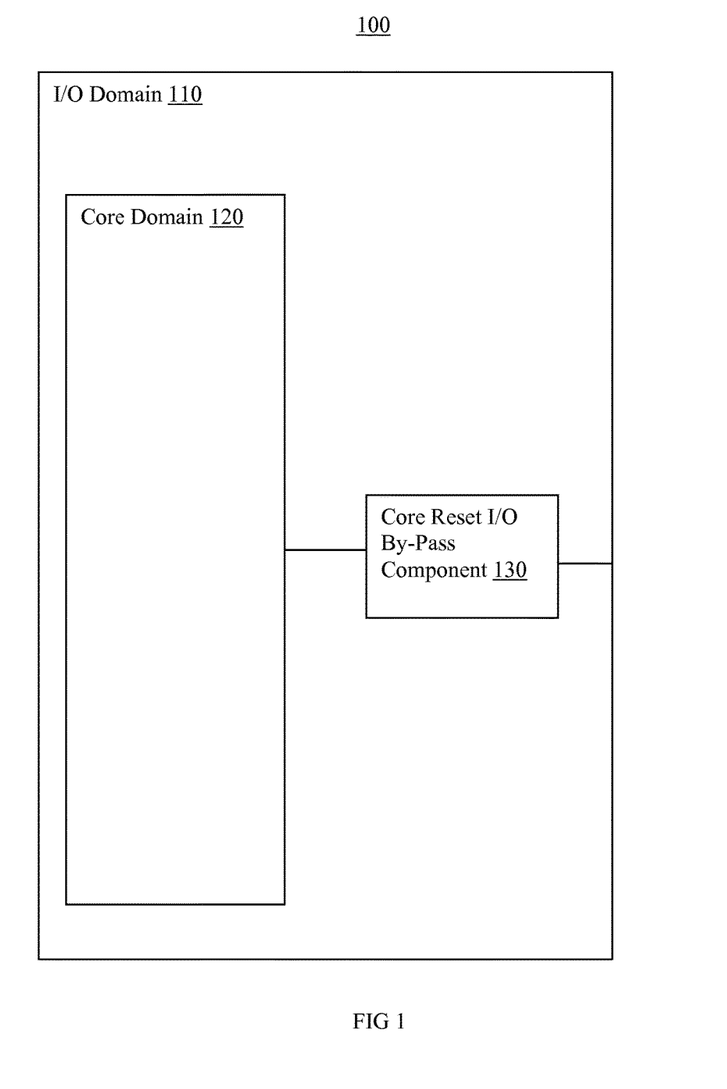
FIG. 1 illustrates the configuration of a split rail integrated circuit that comprises a reset by-pass circuit in accordance with an embodiment of the present disclosure.

FIG. 1 is a block diagram of exemplary system 100 in accordance with one embodiment of the present disclosure. System 100 includes I/O domain 110, core domain 120 and core reset I/O by-pass component 130. The I/O domain 110 is electrically coupled to core domain 120 which is electrically coupled to core reset I/O bypass component 130. The components of system 100 cooperatively operate to perform a variety of functions including efficient reset. The I/O domain 110 is operable to perform various I/O functions with exterior components (not shown). The core domain 120 is operable to perform various core functions. The core reset I/O by-pass component 130 is operable to forward a reset indication for the core domain 120 independent of the I/O domain 110.

In one exemplary implementation, the core reset I/O by-pass component 130 is operable to forward a reset indication before I/O domain 110 comes up. In one exemplary implementation, the core reset I/O by-pass component 130 is operable to receive a reset indication at a voltage level different than the core domain voltage level and provide a corresponding core reset indication to the core at a voltage level safe for the core domain. In one embodiment, the reset I/O by-pass component 130 receives an external reset indication at a voltage level comparable to the I/O domain voltage level and forwards the core reset indication to the core at a nominal core voltage value.

Figure 2:
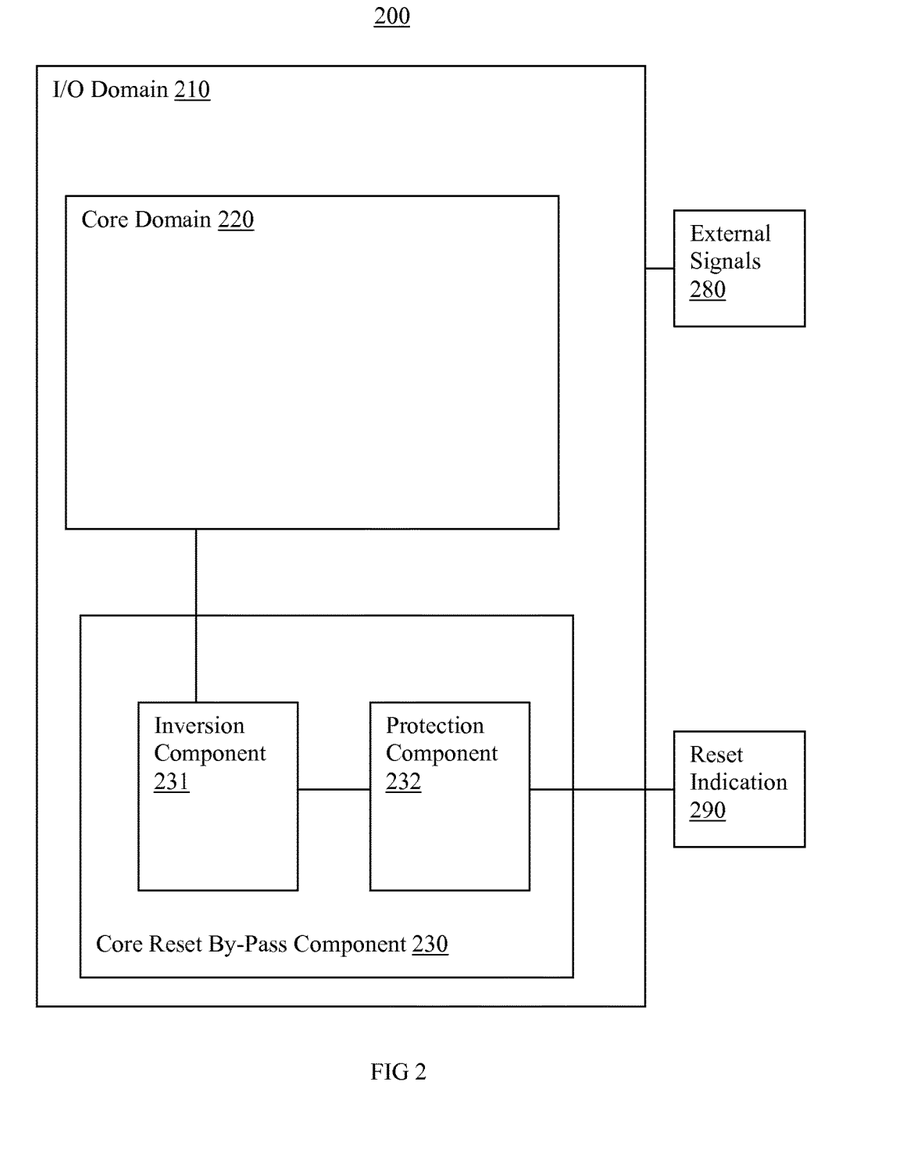
FIG. 2 illustrates a system of resetting core domain circuits with a reset signal sent from a global reset chip circuit without powering up the I/O domain circuits in accordance with an embodiment of the present disclosure.

FIG. 2 is a block diagram of exemplary system 200 in accordance with one embodiment of the present disclosure. System 200 includes I/O domain 210, core domain 220 and core reset I/O by-pass component 230. In one embodiment, system 200 is similar to system 100. In one embodiment, core reset I/O by-pass component 230 includes inversion component 231 and protection component 232. In one exemplary implementation, protection component 232 ensures a reset indication is forwarded to the core domain at a voltage level that is safe for the core domain, even if the reset indication is received by the core reset I/O by-pass circuit 230 at a voltage level that is not safe for the core domain 220. It is appreciated that the protection component 232 can operate in a variety of ways (e. g., limit the voltage of the reset indication, convert the voltage of the reset indication, etc.). In one embodiment, inversion component 231 inverts a signal associated with the reset indication to a logical level consistent with the logic of the core domain 220. In one exemplary implementation, if the core domain 220 treats a logical 0 indication as a reset indication, inversion component 231 inverts a reset indication to a logical 0 indication.

In one embodiment, system 200 includes a split rail configuration in accordance with an embodiment of the present disclosure. The integrated circuit can include core domain components operating at the core domain voltage VDDC, I/O domain logic components operating at the I/O domain voltage VDDO. The core reset I/O by-pass circuit 230 can receive reset indications at voltages comparable to the nominal I/O domain voltage VDDO and can output reset indications at nominal voltages comparable to the core domain voltage VDDC. It is appreciated that the VDDO (e.g., nominal 1.8V, 2.2V, 3.3V, etc.) and VDDC (e.g., nominal 1.0V, 1.2V, etc.) can be at different levels. The VDDO can be higher than the VDDC or vise versa. In one embodiment, the external signals 208 can operate at VDDE and can be forwarded to the I/O domain 210. In one exemplary implementation, after the I/O domain has been brought up and is operational the I/O domain 210 can forward the external signals 208 to the core domain 220 at a voltage safe for the core domain 220.

In one embodiment, an external reset indication essentially circumvents the I/O domain logic while proceeding independently with a reset or power up of the core domain logic circuits to their predictable default operation status. In one exemplary implementation, the I/O domain logic can be subsequently powered up or reset according to the default values sent from the core domain logic. The process can ensure the I/O domain logic is powered up in a controlled process without the issues of leakage currents. As a result, power consumption is reduced. Moreover, in one embodiment during a core reset process, the I/O rail is not required to power up before the input reset signal can be asserted to reset the core circuits and the overall time that the core domain logic requires to respond to the reset signal is reduced.

Figure 4:
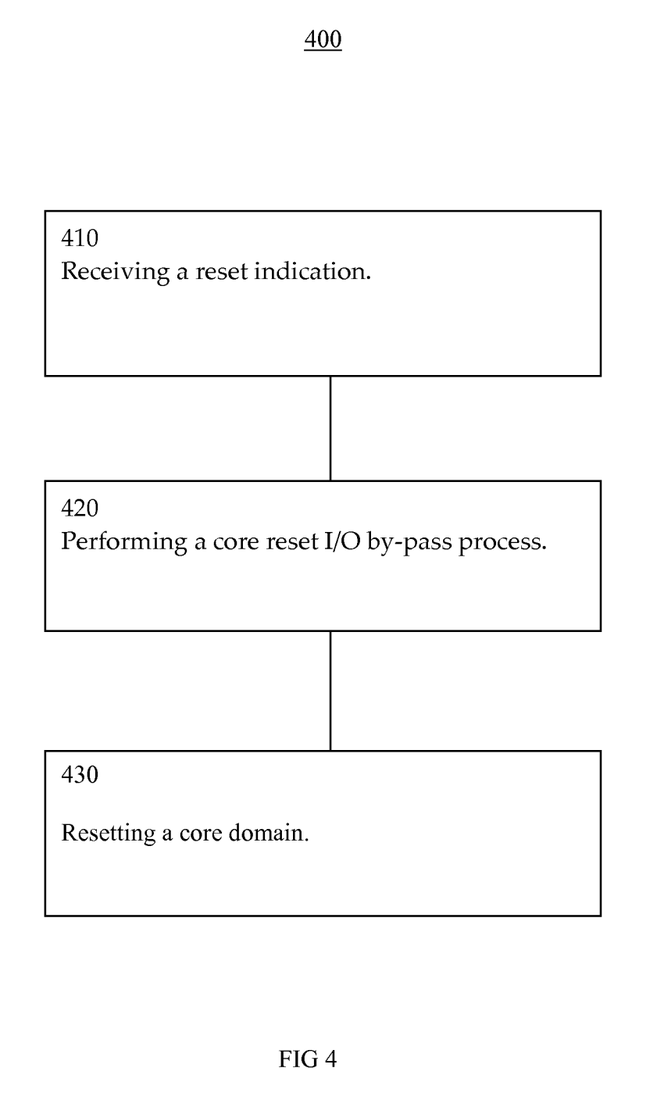
FIG. 4 is a block diagram of exemplary core reset method in accordance with one embodiment of the present invention.

FIG. 4 is a block diagram of exemplary core reset I/O by-pass method 400 in accordance with one embodiment of the present invention.

In block 410, a reset indication is received. In one embodiment, a reset indication is received from an external source. In one exemplary implementation, the reset indication is an input reset signal at a high voltage domain VDDH as first received.

In block 420, a core reset I/O by-pass process is performed. In one embodiment, a core reset I/O by-pass process forwards a reset to a core domain independent of the I/O domain. In one embodiment, a core domain is protected from a reset indication signal that is at an unsafe voltage level. In one exemplary implementation, a core reset indication is forwarded at a voltage level safe for core domain logic.

In block 430, a core domain is reset. In one embodiment, core functional components are reset to start up in a known or predetermined state (thereby facilitating predictable results) rather than random states and unreliable results.

In one embodiment, the I/O rail can be either powered up or powered down while the core rail is powered up.

Figure 5:
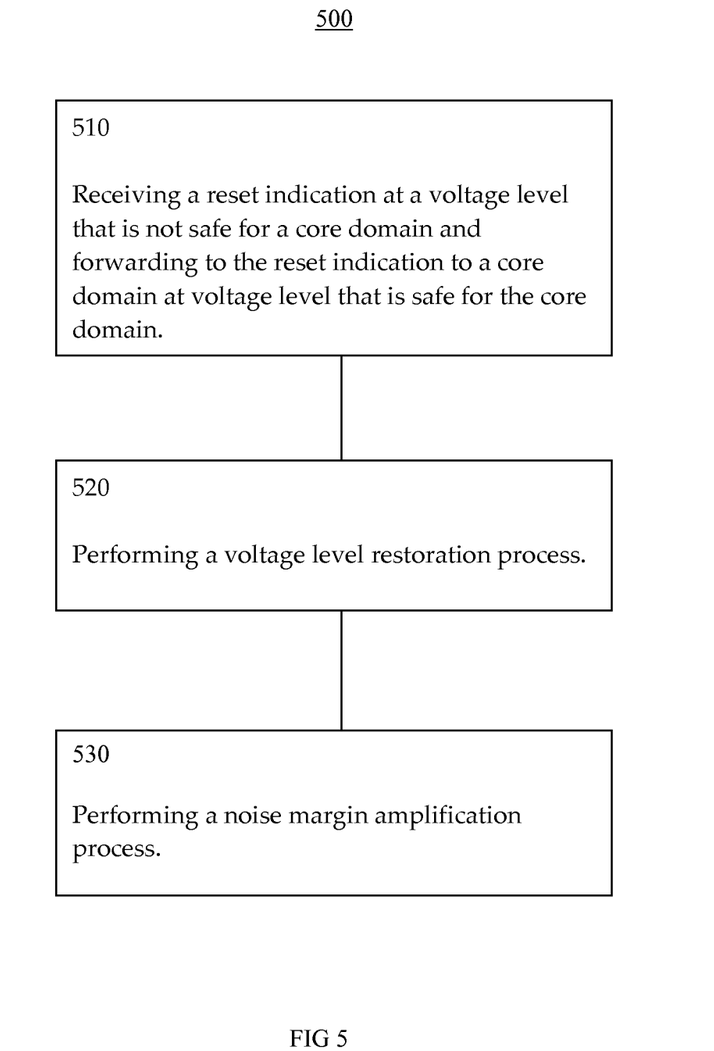
FIG. 5 is a block diagram of exemplary core reset I/O by-pass method in accordance with one embodiment of the present invention.

FIG. 5 is a block diagram of exemplary core reset I/O by-pass method 500 in accordance with one embodiment of the present invention. Core reset I/O by-pass method 500 can be performed independent of I/O domain operations. Core reset I/O by-pass method 500 is similar to block 420 of core reset I/O by-pass method 400.

In block 510, a reset indication received at a voltage level that is not safe for a core domain is forwarded to the core domain at voltage level that is safe for the core domain. In one embodiment, the reset signal is converted to a low power domain level that is compatible with the core domain logic. The converted reset signal may be lower than the nominal VDDC due to the threshold voltage of the transistor used in the protection circuit, as will be discussed in details below.

In block 520 a voltage level restoration process is performed. In one embodiment, the converted reset signal is then pulled up to the nominal VDDC level.

In block 530 a noise margin amplification process is performed. In one embodiment, because the converted reset signal may still carry a relatively large noise range (e.g., similar to the input reset signal), the core domain logic noise margin is amplified accordingly so that the core domain logic can correctly read the forwarded reset signal. Traditional core domains often operate with relatively small noise margins (e.g., 200 mV. etc.) while the presented noise margin amplification process can accommodate relatively large noise margins (e.g., 400 mV, etc.).

Figure 3:
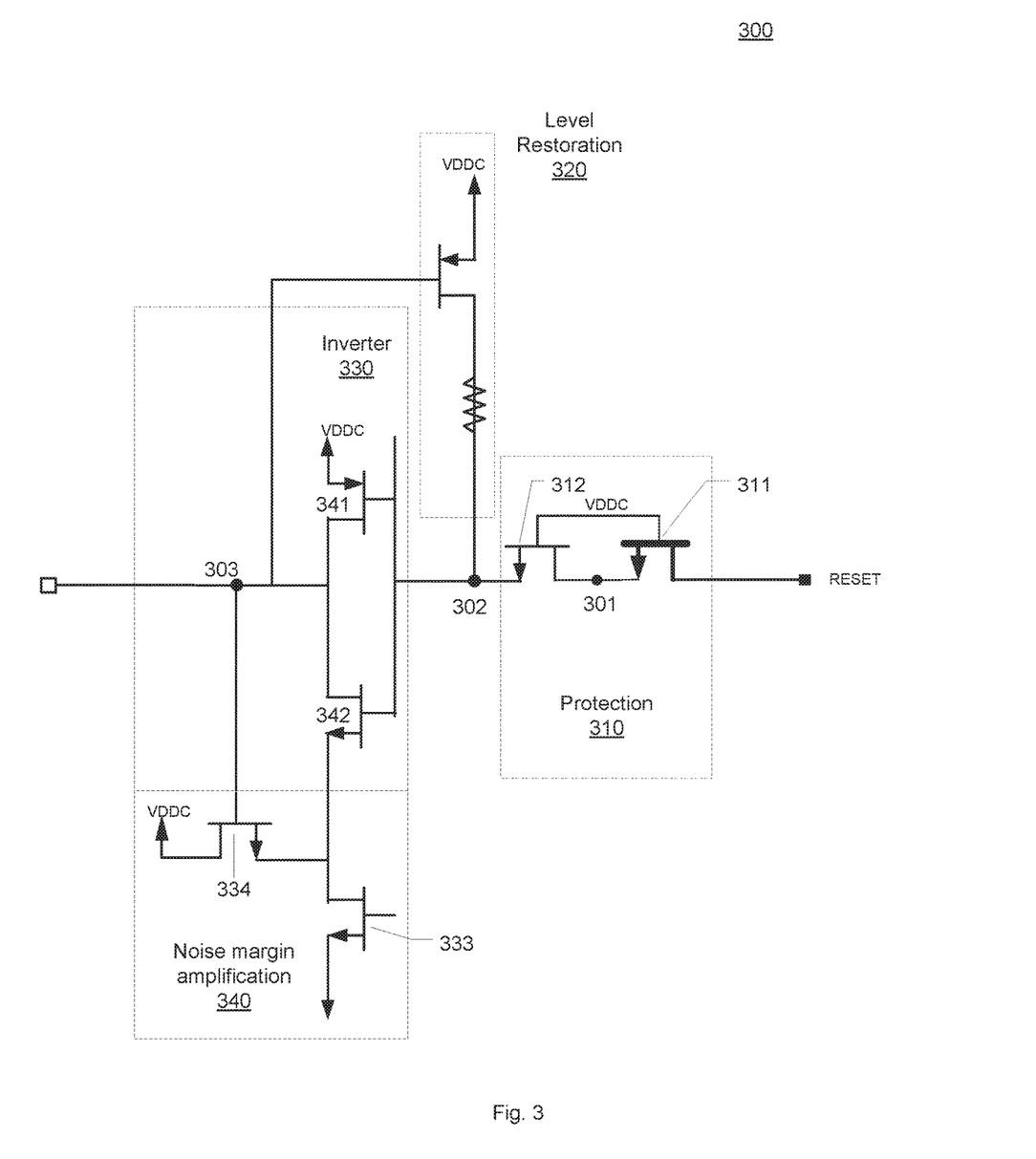
FIG. 3 illustrates the configuration of a reset by-pass circuit that is capable of forwarding a reset signal sent from the global reset chip circuit without powering up the I/O rail in accordance with an embodiment of the present disclosure.

FIG. 3 is a block diagram of exemplary core reset I/O by-pass system 300 in accordance with one embodiment of the present disclosure. Core reset I/O by-pass system 300 includes a protection circuit 310, a level restoration circuit 320 and an inverter 330. In one embodiment, the inverter 330 includes noise margin amplification circuit 340.

The protection circuit 310 includes a thick layer oxide NMOS 311 coupled in series to a thin layer oxide NMOS 312, both having the gate coupled to the VDDC. The protection circuit 310 receives an external input reset signal through the drain of the NMOS 311. In one exemplary implementation the reset signal comes from a global chip reset circuit (not shown). The NMOS 311 is selected such that it is capable of operating at the VDDC but can reliably tolerate the VDDH level without suffering unacceptable oxide stress. Limited by the threshold voltage of the NMOS 311, Vth_thick, the reset signal is reduced to be approximately equal to or less than VDDC-Vth_thick at node 301 between the NMOS 311 and the NMOS 312. In order to preserve the reset signal to a level that is high enough to drive the other components of the reset by-pass circuits and the core logic, the NMOS 311 with a relatively small Vth_thick may be employed. In some embodiments, a thick layer native oxide NMOS can be employed as NMOS 311 which is characteristic of a low and even negative threshold voltage (e.g., 0-200 mV, etc.). In one exemplary implementation, a voltage of 1.2V results at node 301 and the thin layer NMOS 312 thus receives a voltage no more than VDDC-Vth_thick at node 301 which poses no or minimal risk of oxide stress for the core domain circuits. Similarly limited by the threshold of the NMOS 312, the reset signal at 302 is converted to a reset signal of approximately equal to or less than VDDC-Vth_thin. In this configuration, the two NMOS transistors act like a single NMOS with a threshold of Vth_thin and capable of tolerating the input reset signal at VDDH.

The restoration circuit 320 includes a PMOS 321, a large resistor 322. The PMOS 321 has the source coupled to VDDC, the drain coupled to the output of the protection circuit 310 at node 302 which is also the input of the inverter 330, and the gate coupled to the output of the inverter 330 at node 303.

Inverter 303 includes a PMOS 341, NMOS 342 and noise margin amplification circuit 340. In the embodiment illustrated in FIG. 3, a Schmitt-trigger circuit is included in the noise amplification circuit 340 to achieve wide noise margin of the core domain circuits in response to the reset signal. Schmitt triggers can increase VIL and VIH through hysteresis. Because the core domain logic circuits operate at VDDC that is typically much lower than input reset signal sent from a global chip reset circuit, the VIH noise margin is implied in the context of FIG. 3 and therefore, only a half-Schmitt trigger is employed to increase the VIL. The half-Schmitt trigger comprises NMOS 333 and 334. The input of the half-Schmitt trigger is connected to NMOS 342 and the output of the half-Schmitt trigger is connected to the Node 303. In one embodiment, a full Schmitt can be used to increase both VIL and VIH. In another embodiment, other types of suitable circuits may be used to increase the noise margins of the core logic circuits in response to the converted reset signal.

In one embodiment, the protection circuit 310 receives an input reset signal at a VDDH level and outputs a converted reset signal at a reduced voltage level such that the converted reset signal is compatible with the VDDC domain. The reduced voltage level can help reduce or minimize oxide stress issues. The level restoration circuit 320 then receives the converted reset signal and pulls the converted signal to the nominal VDDC level. Thus, a restored reset signal at VDDC level is produced by the level restoration circuit 320. The noise margin circuit 340 functions to increase the noise margins of the core domain logic in response to the restored reset signal to prevent errors caused by noise margin incompatibility. Consequently, core domain logic circuits receive a reset signal at the nominal VDDC level from the reset by-pass circuit with wide noise margins and thereby can be set to reboot status safely. In some embodiments, the VDDH can be the same as VDDO.

When the protection circuit 310 outputs a converted reset signal at 302 as logic high, the inverter outputs a logic low at 303, making the gate of the PMOS 321 logic low and consequently pulling the voltage of its drain to the same level as its source which is VDDC. Thus, the converted reset signal at 302 is restored to the nominal VDDC from VDDC-Vth_thin. The resistor 322 connected in between the drain of the PMOS 321 and node 321 has a large resistance to prevent interference with the input reset signal. In some embodiments, other type of suitable circuit may be used to pull the converted reset signal to the nominal VDD level.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. An integrated circuit comprising:
a first N channel transistor comprising: a drain configured to receive an input signal at a first voltage; and a gate coupled to receive a second voltage;
a second N channel transistor comprising: a drain coupled to a source of said first N channel transistor; and a gate coupled to said second voltage, wherein said first voltage is larger than said second voltage, and wherein further the source of said second N channel transistor is operable to output a converted signal that is smaller than or substantially equal to said second voltage.

2. The integrated circuit as described in claim 1 further comprising a level restoration circuit coupled to a source of said second N channel transistor, and operable to generate a restored signal by pulling said converted signal to a full swing of said second voltage.

3. The integrated circuit as described in claim 2,
wherein said level restoration circuit comprises a P channel transistor comprising a source connected to said second voltage; a drain coupled to the source of said second N channel transistor through a resistor; and a gate connected to an output of an inverter;
wherein said level restoration circuit is transparent to said input signal; and
wherein further said inverter has an input coupled to said converted signal.

4. The integrated circuit as described in claim 3 further comprising a noise margin amplification circuit, coupled to said source of said second N channel transistor and operable to forward said restored signal as an input to a logic circuit and increase a noise margin of said logic circuit in response to the restored signal, said logic circuit configured to operate at said second voltage.

5. The integrated circuit as described in claim 4, wherein said noise margin amplification circuit comprises a half-Schmitt trigger circuit having an input connected to the source of said second N channel transistor, and an output connected to said logic circuit, and wherein said noise amplification circuit is operable to increase a Voltage-In-Low (VIL) of said logic circuit in response to said restored signal.

6. The integrated circuit as described in claim 5, wherein said input signal is a reset indication for resetting said logic circuit.

7. The integrated circuit as described in claim 1, wherein said first voltage is at least in part based on an Input/Output (I/O) power domain of said integrated circuit; wherein said second voltage is at least in part based on a core power domain of said integrated circuit; and wherein said integrated circuit is independent of circuits in the I/O power domain.

8. The integrated circuit as described in claim 1, wherein said first N channel transistor is a native thick oxide N channel transistor.

9. A system comprising:
a core domain portion configured to operate at a nominal core domain voltage level;
an I/O domain portion operating at a nominal I/O domain voltage level that is different from said nominal core domain voltage level; and
a core reset I/O by-pass component configured to forward a reset indication to the core domain portion, wherein said core reset I/O by-pass component comprising:
a first N channel transistor comprising: a drain configured to receive a reset signal at a first voltage; and a gate coupled to receive a second voltage; and
a second N channel transistor comprising: a drain coupled to a source of said first N channel transistor; and a gate connected to said second voltage, wherein said first voltage is larger than said second voltage, and wherein further the source of said second N channel transistor is operable to output a converted signal that is smaller than or substantially equal to said second voltage.

10. The system as described in claim 9, wherein said core reset I/O by-pass component further comprises a level restoration circuit coupled to a source of said second N channel transistor, and operable to generate a restored signal by pulling said converted signal to a full swing of said second voltage.

11. The system as described in claim 10,
wherein said level restoration circuit comprises a P channel transistor comprising a source connected to said second voltage; a drain coupled to the source of said second N channel transistor through a resistor; and a gate connected to an output of an inverter;
wherein said level restoration circuit is transparent to said reset signal; and
wherein further said inverter has an input coupled to said converted signal.

12. The system as described in claim 10, wherein said core reset I/O by-pass component further comprises a noise margin amplification circuit coupled to said source of said second N channel transistor and operable to forward said restored signal as an input to a core domain logic circuit and increase a noise margin of said core domain logic circuit in response to the restored signal.

13. The system as described in claim 12, wherein said noise margin amplification circuit comprises a half-Schmitt trigger circuit having an input connected to the source of said second N channel transistor, and an output connected to said core domain logic circuit, and wherein said noise amplification circuit is operable to increase a Voltage-In-Low (VIL) of said core domain logic circuit in response to said restored signal.

14. The system as described in claim 9, wherein said first voltage is substantially equal to said nominal I/O domain voltage level, wherein said second voltage is substantially equal to said nominal core domain voltage level, and wherein said core reset I/O by-pass component is independent of circuits in said I/O domain portion.

15. The system as described in claim 9, wherein said first N channel transistor is a native thick oxide N channel transistor.

16. A system comprising:
a first N channel transistor comprising: a drain configured to receive an input signal substantially at a first voltage; and a gate coupled to receive a second voltage, wherein said first N channel transistor is a thick oxide N channel transistor; and
a second N channel transistor comprising: a drain coupled to a source of said first N channel transistor; and a gate connected to said second voltage, wherein said first voltage is larger than said second voltage, and wherein further the source of said second N channel transistor is operable to output a converted signal that is smaller than or substantially equal to said second voltage.

17. The system as described in claim 16, wherein said first voltage is at least in part based on an Input/Output (I/O) power domain of said system, and wherein said second voltage is at least in part based on a core power domain of said system.

18. The system as described in claim 16 further comprising a level restoration circuit coupled to a source of said second N channel transistor, and operable to generate a restored signal by pulling said converted signal to a full swing of said second voltage.

19. The system as described in claim 18, wherein said level restoration circuit comprises: a P channel transistor comprising a source connected to said second voltage; a drain coupled to the source of said second N channel transistor through a resistor; and a gate connected to an output of an inverter,
   wherein said level restoration circuit is transparent to said input signal; and
   wherein further said inverter has an input coupled to said converted signal.

20. The integrated circuit as described in claim 19 further comprising a noise margin amplification circuit, coupled to said source of said second N channel transistor and operable to forward said restored signal as an input to a logic circuit in a core power domain of said system and increase a noise margin of said logic circuit in response to the restored signal.

\* \* \* \* \*